United States Patent [19]
Wagner et al.

[11] Patent Number: 5,457,605
[45] Date of Patent: Oct. 10, 1995

[54] ELECTRONIC DEVICE HAVING COPLANAR HEATSINK AND ELECTRICAL CONTACTS

[75] Inventors: Robert Wagner, Mesa; Joel R. Gibson, Chandler; Scott McCall, Gilbert, all of Ariz.

[73] Assignee: Motorola, Inc., Schaumburg, Ill.

[21] Appl. No.: 155,879

[22] Filed: Nov. 23, 1993

[51] Int. Cl.⁶ .................................................. H05K 7/20
[52] U.S. Cl. ......................... 361/720; 174/52.3; 257/675; 361/778; 439/68
[58] Field of Search ........................... 439/55, 68, 70, 439/72, 485, 78–82, 487; 174/52.1, 252, 16.3, 52.3, 52.4; 257/675, 704, 706, 707, 712, 713, 720; 165/80.5, 185; 361/813, 816, 761, 764, 776–778, 736, 752, 704, 707, 709, 712, 715, 717–720

[56] References Cited

U.S. PATENT DOCUMENTS

| | | |
|---|---|---|
| 4,298,769 | 11/1981 | Richman . |
| 4,729,061 | 3/1988 | Brown .................................. 361/719 |
| 4,783,697 | 11/1988 | Benenati et al. . |
| 4,879,633 | 11/1989 | Kaufman .............................. 361/386 |
| 5,012,386 | 4/1991 | McShane ............................. 361/386 |
| 5,025,347 | 6/1991 | Shindo ................................. 361/719 |
| 5,057,805 | 10/1991 | Kadowski ............................ 333/247 |
| 5,069,626 | 12/1991 | Patterson et al. . |
| 5,075,759 | 12/1991 | Moline . |
| 5,105,259 | 4/1992 | McShane ............................. 357/72 |
| 5,172,301 | 12/1992 | Schneider ............................ 361/717 |
| 5,276,584 | 1/1994 | Collins ................................. 361/709 |
| 5,307,237 | 4/1994 | Walz .................................... 361/778 |

Primary Examiner—Gerald P. Tolin
Attorney, Agent, or Firm—William E. Koch

[57] ABSTRACT

An electronic device (100) has a heatsink (116) and electrical contacts (120) which are originally all part of a support frame (200). After assembly, the border of the support frame (202) is broken off, thereby electrically isolating the electrical contacts (120) from one another, and from the heatsink (116). The electrical contacts (120) and the heatsink (116) are coplanar. In one version, the electrical contacts (120) do not extend past the circuit board (102) of the device (100).

6 Claims, 1 Drawing Sheet

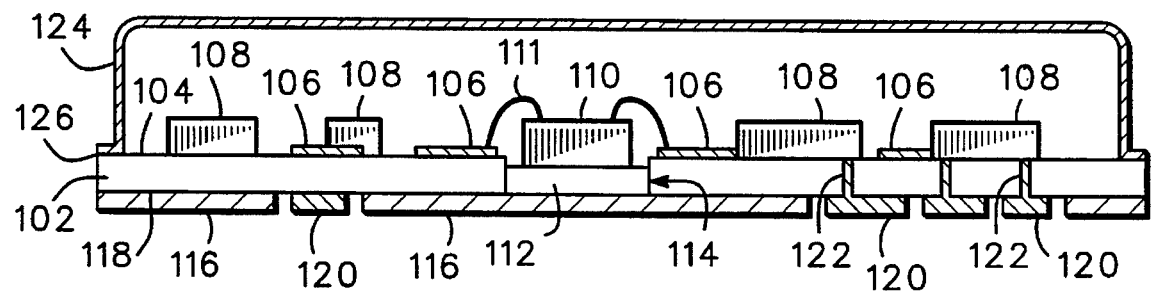
*FIG. 1* ↙100
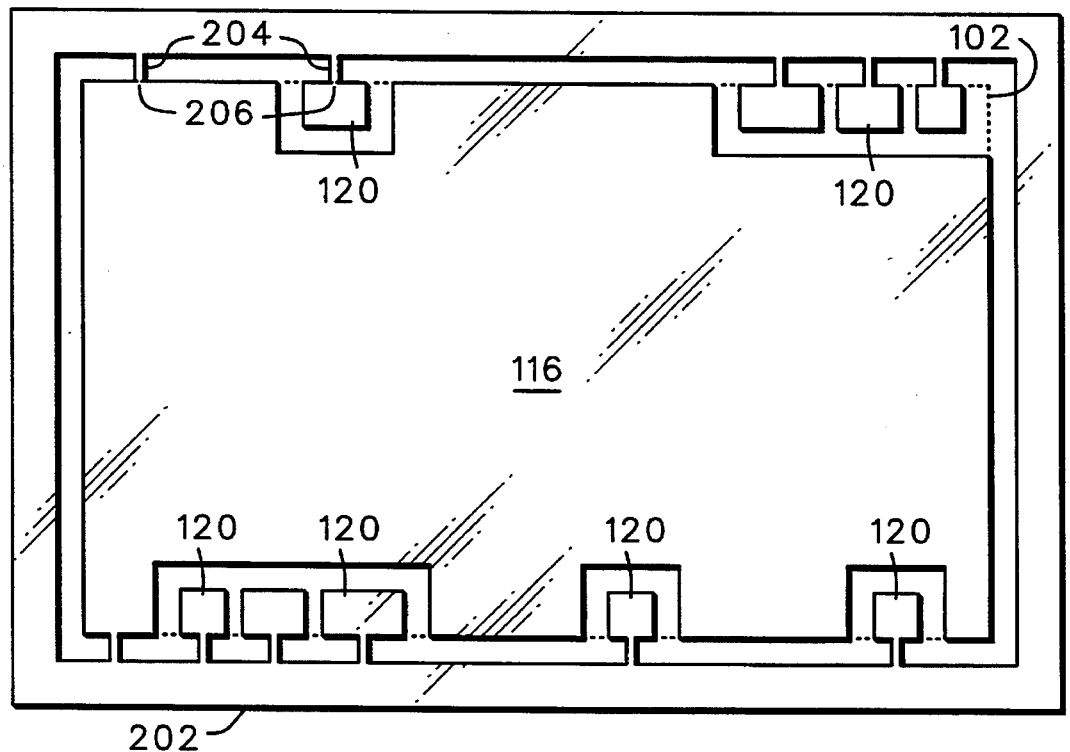
*FIG. 2* ↙200
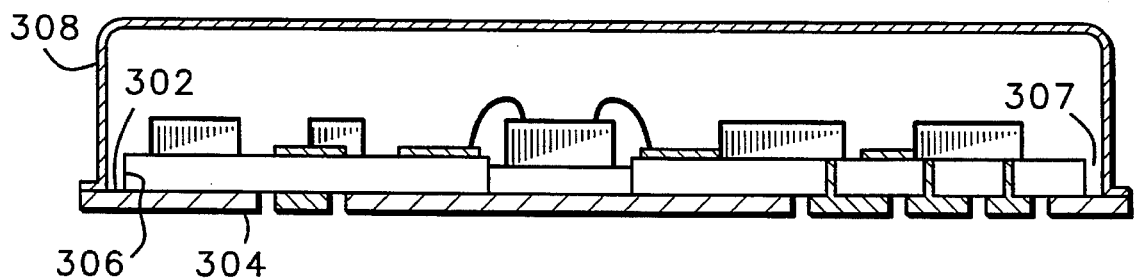
*FIG. 3* ↙300

5,457,605

ELECTRONIC DEVICE HAVING COPLANAR HEATSINK AND ELECTRICAL CONTACTS

FIELD OF THE INVENTION

The present invention relates to electronic devices, and more particularly to electronic devices having coplanar heatsinks and electrical contacts.

BACKGROUND OF THE INVENTION

In the past, electronic devices such as radio frequency (RF) amplifiers have been packaged in configuration with formed leads providing electrical contact to the RF amplifier. The formed leads have typically been gullwing-shaped. Furthermore, a heatsink slug has typically been attached to the bottom of the package in the clearance area provided by the bend of the gullwing. Conventional assembly techniques require that all of the gullwing leads and the plane of the heatsink be coplanar, within very strict tolerances. Consequently, the gullwing leads often require manual adjusting in order to make them coplanar with one another and with the heatsink slug attached to the package. An additional disadvantage arises in that during shipping the leads may be bent out of the required planarity and become unacceptable to the customer.

Consequently, what is needed is an electronic device which does not require preformed leads. Furthermore, it would be desirable if the electrical contacts of the device did not require adjustment for planarity with other respective electrical contacts and the heatsink of the device. Furthermore, it would be desirable if the electrical contacts of the device were not susceptible to bending during shipment and other handling.

BRIEF DESCRIPTION OF THE DRAWINGS

FIG. 1 is a simplified cross section view of an electronic device in accordance with one embodiment of the present invention;

FIG. 2 is a bottom view of an electronic device in accordance with one embodiment of the present invention; and FIG. 3 is a simplified cross section view of an electronic device in accordance with an alternate embodiment of the present invention.

DETAILED DESCRIPTION OF THE DRAWINGS

Generally stated, the present invention comprises an electronic device having coplanar heatsink and electrical contacts. More specifically, one embodiment of the present invention comprises a printed wire board, populated with components, attached to a support frame. The support frame includes both the heatsink and electrical contacts for the device. The support frame is formed out of a single piece of frame material, typically stamped metal. During assembly, the support frame is attached to the bottom of the printed wire board. The circuit components are electrically connected to the electrical contacts by plated through holes.

The support frame includes a surrounding frame border. After the printed wire board is attached to the support frame, the surrounding frame border is broken off such that the electrical contacts become electrically isolated from the remainder of the support frame, including the heatsink.

Turning to the figures for a more detailed understanding, FIG. 1 is a simplified cross section of an electronic device in accordance with one embodiment of the present invention. FIG. 1 is electronic device 100, which in the preferred embodiment is an RF amplifier. RF amplifier 100 comprises printed wire board 102. It will be understood by those with average knowledge of the industry that printed wire board 102 may comprise a variety of materials such as ceramic or polyimide.

Printed wire board 102 comprises a board top surface 104. In the embodiment shown, board top surface 104 is a trace layer, indicated by printed traces 106. The top surface of printed wire board 102 is populated with a variety of electronic components which make up the circuit of the RF amplifier. The electronic components are represented by components 108. Components 108 are electrically coupled as necessary to form the required circuit by traces represented by traces 106.

Additionally, in the embodiment illustrated, RF amplifier 100 includes active device 110. Active device 110 is mounted on substrate 112. It will be understood that substrate 112 may comprise a copper heatsink slug, or other substrate as required by the nature of active device 110 in the circuit of RF amplifier 100.

Active device 110 and substrate 112 are mounted, through opening 114 in printed wire board 102, directly to heatsink 116. The processes for fabrication and assembly of the above described components and circuitry will be well understood by those with average knowledge of the industry.

Printed wire board 102 comprises board bottom surface 118. Board bottom surface 118 is attached to metal heatsink 116 and electrical contacts 120. Electrical contacts 120 provide contact from the RF amplifier to external circuitry (not shown). It will be understood that electrical contacts 120 are electrically isolated from metal heatsink 116.

Electrical contacts 120 are formed from the same support frame material as metal heatsink 116 (described in more detail below), and are consequently inherently entirely coplanar with metal heatsink 116. In the embodiment illustrated, electrical contacts 120 and metal heatsink are formed from beryllium copper having thickness in the range of 0.152–0.203 mm. It will be understood by those with average knowledge of the industry that many other materials and thicknesses may be used for the contacts and heatsink, depending upon the particular application.

Printed wire board 102 further comprises electrical connections 122 which provide electrical connections from the components of RF amplifier 100 to electrical contacts 120. In the embodiment illustrated, electrical connections 122 comprise plated through holes, as are well understood by those with average knowledge of the industry.

RF amplifier 100 further comprises device lid, or cover, 124. Device lid 124 is preferably a metal lid which provides radio frequency interference shielding for RF amplifier 100, as well as protection from the environment. In the embodiment illustrated in FIG. 1, device lid 124 is attached to board top surface perimeter edge 126. Preferably, board top surface perimeter edge 126 comprises a metallized border to which lid 124 can be soldered.

Turning to FIG. 2, FIG. 2 is a bottom view of the electronic device of FIG. 1, still attached to the border of the support frame which includes heatsink 116 and electrical contacts 120. More particularly, support frame 200 is a single piece of frame material. In the particular embodiment discussed, the frame material comprises beryllium copper with a thickness in the range of 0.152–0.203 mm. The support frame material may be plated, as convenient, depending upon the particular application. The fabrication of support frame 200 will be well understood by those with average knowledge of the industry, and includes such methods as stamping or etching.

Support frame 200 includes border section 202. Border section 202 surrounds heatsink 116 and electrical contacts 120. Border portion 202 is integrally attached to heatsink 116 and electrical contacts 120 via connecting portions represented by connecting portions 204. Connecting portions 204 may be designed so that they are easily broken away from heatsink 116 and electrical contacts 120 once printed wire board 102 is mounted on support frame 200. One method of achieving this is to score connecting portions 204 at the edge of the perimeter of printed wire board 120. The perimeter of printed wire board 120 is indicated by the dashed lines. The score of connecting portions 204 is represented by score 206.

Referring briefly back to FIG. 1, those with average knowledge of the industry will recognize a variety of straightforward assembly methods for assembling RF amplifier 100. One exemplary method includes the step of populating printed wire board 102 with electronic components 108. Next, a solder pattern is applied to support frame 200. Printed wire board 102 is then situated on support frame 200 in an alignment boat (well known, and not shown) which has alignment mechanisms to align printed wire board 102 properly to support frame 200. Next, substrate 112 and active device 110 are placed in opening 114 of printed wire board 102. The solder which has been patterned on support frame 200 is reflowed, thereby attaching printed wire board 102 and substrate 112 to support frame 200. Subsequently, active device 110 is electrically connected to the remainder of the circuitry via wire bonds 111. A silicone die coat is then applied to protect the electronic components from the environment.

Solder is then applied to board top surface perimeter edge 126 for attaching lid 124. Lid 124 is situated along board top surface perimeter edge 126, and the patterned solder is reflowed. As one of the final steps, border portion 202 and attachment portions 204 are broken free from heatsink 116 and electrical contacts 120 along scores 206.

It will be apparent by those skilled in the industry that the embodiment illustrated which is in accordance with the present invention provides an improved electronic device because it is very easily assembled and the resultant device has electrical contacts which are inherently coplanar to the remainder of the device, specifically heatsink 116. Such a device is particularly useful as a surface mount device which requires critical coplanarity along the bottom surface of the device.

Turning to FIG. 3, FIG. 3 is a simplified cross-section of an electronic device in accordance with an alternative embodiment of the present invention. An important distinction of the device illustrated in FIG. 3 is foot portions 302 of heatsink 304. Heatsink 304 is analogous to heatsink 116 of FIGS. 1 and 2. However, heatsink 304 includes foot portions 302 which extend beyond the printed wire board perimeter 306. Device lid 308 is attached to foot portions 302 rather than the printed wire board, as in the earlier discussed embodiment. It will be understood by those with average knowledge of the industry that lid 308 may be sized to just fit around the printed wire board, in which case gap 307 would not exist. Such a configuration would provide for simplified alignment and assembly of lid 308 onto foot portions 302.

It will also be recognized that foot portions 302 need not entirely surround heatsink 304. Rather, only intermittent foot portions may be required, still providing adequate attachment surfaces for lid 308.

By now it will be appreciated that an improved electronic device has been described which provides improved coplanarity between respective electrical leads, and between the leads and the remainder of the package. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:
1. An electronic device, comprising:
a printed wire board including a board perimeter, a trace layer and a board bottom surface;
a plurality of electronic components contacting the trace layer;
a plurality of electrical connections connecting the trace layer to the board bottom surface;
a heatsink disposed on the board bottom surface, the heatsink having a heatsink bottom surface lying entirely in a first plane; and
a plurality of electrical contacts disposed on the board bottom surface, the electrical contacts having respective electrical contact bottom surfaces lying entirely in the first plane, the electrical contacts electrically coupled to the electrical connections and electrically isolated from the heatsink, wherein the electrical contacts do not extend beyond the board perimeter.
2. The device of claim 1, wherein the printed wire board comprises a board top surface perimeter edge, and wherein the device further includes a device cover attached to the board top surface perimeter edge.
3. The device of claim 1, wherein the printed wire board includes a board perimeter, and wherein the heatsink extends beyond the board perimeter, the device further comprising a device cover attached to the heatsink.
4. The device of claim 1, wherein the electronic device comprises a radio frequency amplifier.
5. The device of claim 1, wherein the printed wire board is composed of ceramic material.
6. The device of claim 1, wherein the heatsink and the electrical contacts comprise beryllium copper having a thickness within the range of 0.152–0.203 millimeters.

\* \* \* \* \*